(12) United States Patent
Ufert

(10) Patent No.: US 7,297,975 B2
(45) Date of Patent: Nov. 20, 2007

(54) NON-VOLATILE, RESISTIVE MEMORY CELL BASED ON METAL OXIDE NANOPARTICLES, PROCESS FOR MANUFACTURING THE SAME AND MEMORY CELL ARRANGEMENT OF THE SAME

(75) Inventor: Klaus Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 11/191,837

(22) Filed: Jul. 28, 2005

(65) Prior Publication Data
US 2007/0045704 A1    Mar. 1, 2007

(51) Int. Cl.
*H01L 29/02* (2006.01)
*G11C 11/00* (2006.01)

(52) U.S. Cl. .......................... 257/2; 257/536; 365/148

(58) Field of Classification Search ................ 257/2–5, 257/536, E45.002, E45.003; 365/148
See application file for complete search history.

(56) References Cited

U.S. PATENT DOCUMENTS

2004/0052117 A1* 3/2004 Jiang ........................... 365/200
2006/0250836 A1* 11/2006 Herner et al. ................ 365/148

* cited by examiner

*Primary Examiner*—Mark V. Prenty
(74) *Attorney, Agent, or Firm*—Jenkins, Wilson, Taylor & Hunt, P.A.

(57) ABSTRACT

Disclosed is a non-volatile memory cell including a first conductive electrode region, a second conductive electrode region and a memory region disposed therebetween. The memory region includes one or a plurality of metal oxide nanoparticles, which contact and electrically connect the first and the second electrode region via contact locations and which exhibit a bistable resistance properties when applying an external voltage.

6 Claims, 6 Drawing Sheets

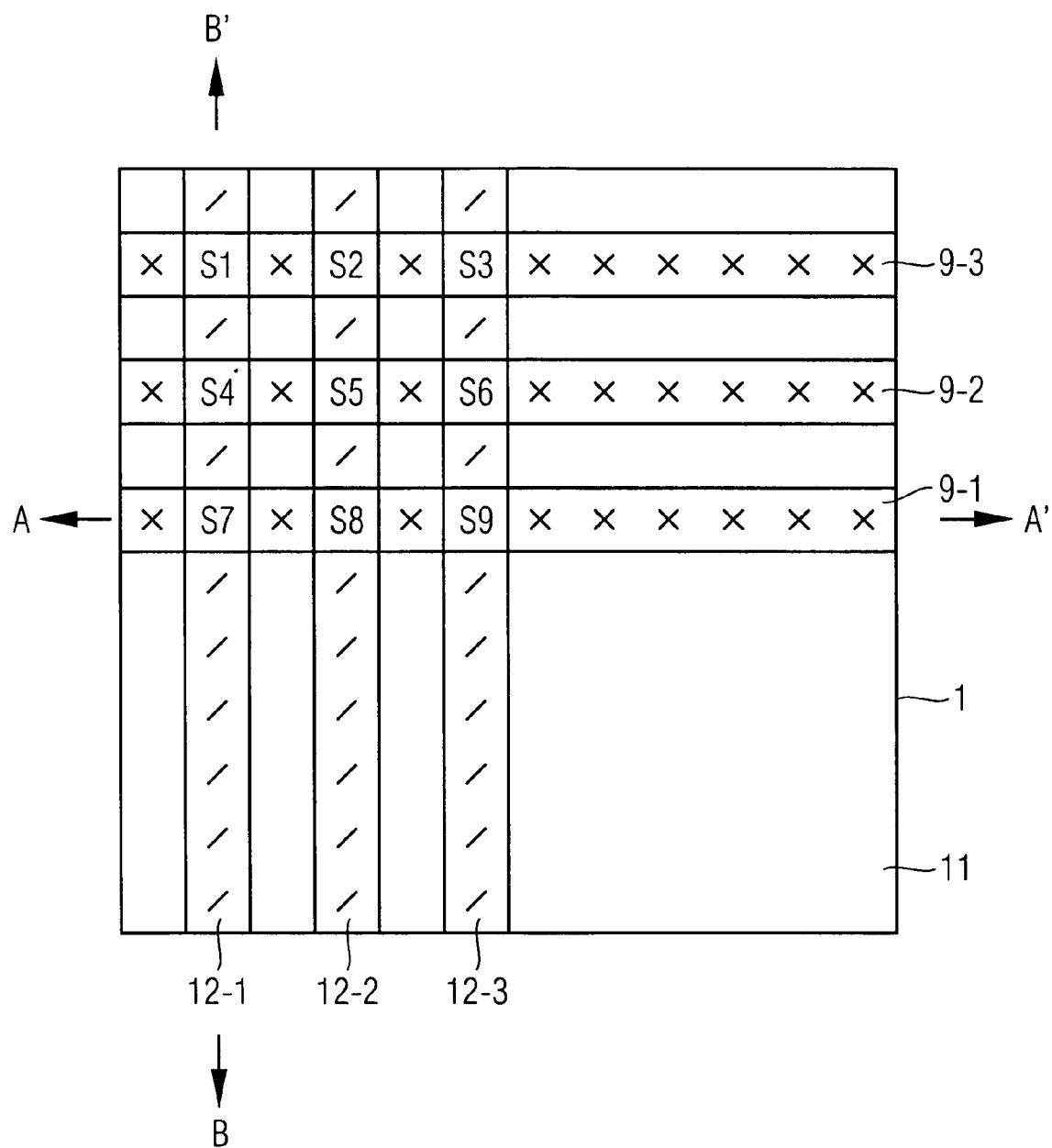

NON-VOLATILE, RESISTIVE MEMORY CELL BASED ON METAL OXIDE NANOPARTICLES, PROCESS FOR MANUFACTURING THE SAME AND MEMORY CELL ARRANGEMENT OF THE SAME

TECHNICAL FIELD

The present invention relates to non-volatile, resistive memory cells based on the bistable resistance properties of metal oxide nanoparticles, a process for manufacturing such a non-volatile memory cell and an arrangement of a plurality of such memory cells to a memory cell arrangement.

BACKGROUND ART

Conventional storage technologies (floating gate memories such as flash and DRAM) are based on the storage of charges in inorganic, silicon-based materials. These technologies for storing electric charges will reach their scaling limits within the near future. Thus, there is increased research for alternative methods for storing information. Herein, the principle of resistive memories based on the bistable resistance change in metal oxide nanoparticles has proven to be promising.

However, with conventional methods for manufacturing resistively switching metal oxide storage materials, active memory cells of few nanometers in dimension are unattainable. The currently used technologies for the deposition of the micro-crystalline storage substance are conventional thin-film techniques, such as vapor deposition or sputtering followed by the oxidation of the metal films (J. F. Gibbons and W. E. Beadle, Solid-State Electron., 7, 785 (1964); W. R. Hiatt and T. W. Hickmott, Appl. Phys. Lett., 6, 106 (1965) and F. Argall, Solid-State Electron., 11, 535 (1968)). During the deposition, induced inner mechanical stress, which may partly be considerably high, may occur in the layers. In addition, this stress may be increased by inhomogeneous heating of a larger layer volume due to the thermistor effect, so that the adhesiveness of the layers often limits the switching cycles, and the layers may peel off (S. Seo, M. J. Lee, D. H. Seo, E. J. Jeoung, D.-S. Suh, Y. S. Joung, I. K. Yoo, I. R. Hwang, S. H. Kim, I. S. Gyun, J.-S. Kim, J. S. Choi and B. H. Park, Appl. Phys. Lett., 85, 5655 (2004) and S. Seo, M. J. Lee, S. K. Choi, D. S. Suh, Y. S. Joung, I. K. Yoo, I. S. Buyn, I. R. Hwang, S. H. Kim, B. H. Park, Appl. Phys. Lett., Vol. 86 (2005), S. 093509). Up to now, bistable switching in nickel oxide has been observed only in connection with chemical conversion or chemical reactions of the oxide material in a narrow filament, wherein the layer was destroyed after a limited number of cycles.

Furthermore, a high storage density cannot be realized with this technology, since a reduction in size is difficult.

The mechanisms for monostable or temporally limited bistable switching are based on isolator breakdown and thermistor effects coupled with the diffusion of contact material into the memory cell and thus allow only a small number of switching cycles. This severely limits the lifetime.

SUMMARY OF THE INVENTION

Thus, it is an object of the present invention to provide a novel type of memory cell that can be easily manufactured. In accordance with the present invention, this object is achieved by the subject matter of original claims 1, 5 and 14.

In accordance with a first aspect of the present invention, a non-volatile memory cell comprises metal oxide nanoparticles arranged between two electrode regions, wherein the metal oxide nanoparticles conductively connect the electrode regions and exhibit bistable resistance properties.

Due to the reduction of the switching and storage effect to only a few or even a single nanoparticle, the memory cell according to the present invention attains a significantly higher storage density at lower cost. Thus, it is possible to realize a lower switching power and faster switching times than in the storage technology with conventionally deposited $NiO_{1-x}$ layers.

The inventive use of metal oxide nanoparticles enables switching between two bistable resistance states in the nanoparticles. Applying a corresponding voltage within a narrow range allows switching between these resistance states. Due to thermal-electronic interaction with trap centers and metal ion diffusion along the nano-crystalline grain boundaries, the state of high conductivity is stabilized. The formation and disruption of the filament region of high conductivity is furthermore coupled to a thermistor effect. This thermistor effect enhances the diffusion process and the charge and discharge processes in the defective states, due to an inhomogeneous temperature distribution in the metal oxide storage material when applying a voltage.

In accordance with a second aspect of the present invention, a process for manufacturing a non-volatile, resistive memory element comprises the following steps: providing a first conductive electrode region on a substrate; arranging metal oxide nanoparticles on the first electrode region; filling the gaps between the metal oxide nanoparticles with a dielectric so that the metal oxide nanoparticles and the dielectric form a common surface; and arranging a second conductive electrode region on said surface.

The invention provides a process for generating metal oxide nanoparticles, e.g. made of non-stoichiometric $NiO_{1-x}$, by chemical deposition of diblock copolymers on a CMOS-compatible contact, using a simple inexpensive low-temperature process.

Due to the smaller dimensions of the metal oxide nanoparticles and the density and homogeneity of the deposition, memory cells with higher density and improved switching and storage properties can be realized. Therein, it is possible to perform bistable switching with only a single particle of about 3 nm×3-5 nm. Thus, the conductive filament can be reduced in the on-state to dimensions below 3 nm. This size corresponds to the limit for thermo-electronic switching and storage effects.

Even when contacting several nanoparticles with a contact pair, the bistable switching is carried out by only one nanoparticle. The nanoparticle that first forms a conductive filament undertakes the storage of information. Thus, when a nanoparticle fails, another nanoparticle can immediately assume the function of the failed nanoparticle. The minimal dimensions for a memory cell are thus limited merely by current CMOS-technology.

The current invention thus provides a non-volatile memory cell based on the bistable resistance property of metal oxide nanoparticles. The process for manufacturing this memory element is based on the formation of nanocrystals which are applied via diblock copolymer monolayers.

According to a further aspect of the present invention, a memory cell arrangement is provided which comprises a plurality of non-volatile memory cells.

According to a preferred embodiment, the metal oxide nanoparticles comprise $NiO_{1-x}$ nanoparticles. Here, x is in the range of 0.5 to 0.95, and preferably between 0.7 and 0.9.

Among metal chalcogenides, nickel oxide has an exceptional position because of its large band gap of about 4.5 eV. At room temperature, nickel oxide in stoichiometric composition is an isolating semiconductor. Furthermore, because of the steepness of its resistance-temperature characteristics when applying an adequate voltage, nickel oxide exhibits a region with negative differential resistance and monostable switching in its I-U-characteristics, due to the thermistor effect.

On the one hand, electronic defects are formed in layers of $NiO_{1-x}$ nanoparticles due to the oxygen deficiency, and on the other hand, there is an increased nickel ion diffusion along the defects and grain boundaries due to the excess nickel. The diffusion of nickel is also a thermally activated process. The result is a very complex process of thermally enhanced interactions of nickel ion diffusion and electric charging and discharging of deep defects which are generated through the oxygen deficiency. Due to the non-stoichiometric composition of $NiO_{1-x}$, this composition is oxygen-deficient.

According to a further preferred embodiment, the first electrode region is a tungsten electrode.

In accordance with a further improved embodiment, the second electrode region is made of aluminum, titanium or platinum.

According to a further preferred embodiment, the substrate is a silicon substrate.

In accordance with a further preferred embodiment, the applied metal oxide nanoparticles are $NiO_{1-x}$ nanoparticles. Herein, x is in a range of 0.5 to 0.95, and preferably 0.7 to 0.9.

According to a further preferred embodiment, the first conductive electrode region is a tungsten bottom contact.

According to a further preferred embodiment, the second conductive electrode region is made of aluminum, titanium or platinum.

According to a further preferred embodiment, the dielectric between the metal oxide nanoparticles includes $SiO_2$, $Si_3N_4$ or $Al_2O_3$.

In accordance with a further preferred embodiment, the dielectric $SiO_2$ is deposited through dissociation of hexamethyldisiloxane.

In accordance with a further preferred embodiment, the metal oxide nanoparticles have a size of 2.5 to 15 nm, and preferably 3 to 8 nm.

In accordance with a further preferred embodiment, the memory cells are arranged in a crosspoint array.

The above and other objects and features of the present invention will become apparent from the following description of preferred embodiments taken in conjunction with the accompanying drawings.

BRIEF DESCRIPTION OF THE DRAWINGS

FIG. 4 shows a memory cell arrangement in the form of a crosspoint array serving as an embodiment of the present invention;

Identical reference symbols in the Figures denote identical or functionally identical components.

DETAILED DESCRIPTION OF THE INVENTION

Figure 1:
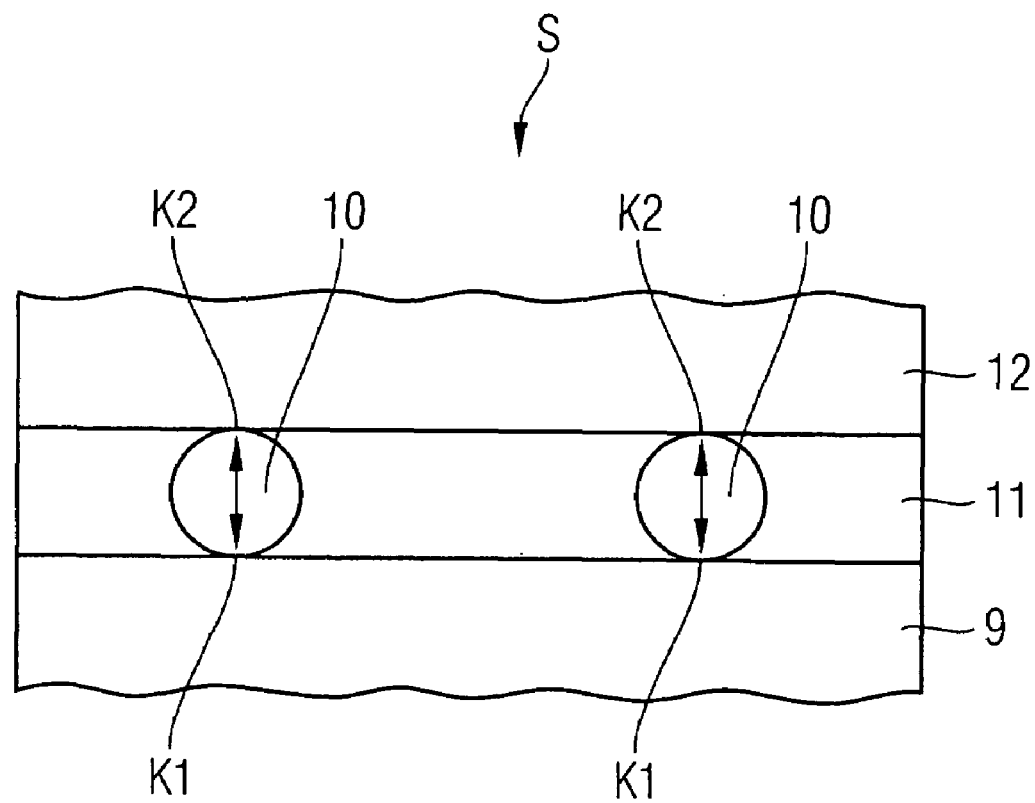
FIG. 1 diagrammatically shows an arrangement of metal oxide nanoparticles embedded in a dielectric between two electrodes in an embodiment of the present invention.

FIG. 1 illustrates a memory element S. Two nanoparticles 10 of, for example, $NiO_{1-x}$ are embedded in an isolating matrix 11 of a dielectric. The nanoparticles 10 contact a bottom contact 9 via contact locations K1 and a top contact 12 via contact locations K2.

Figure 2A:
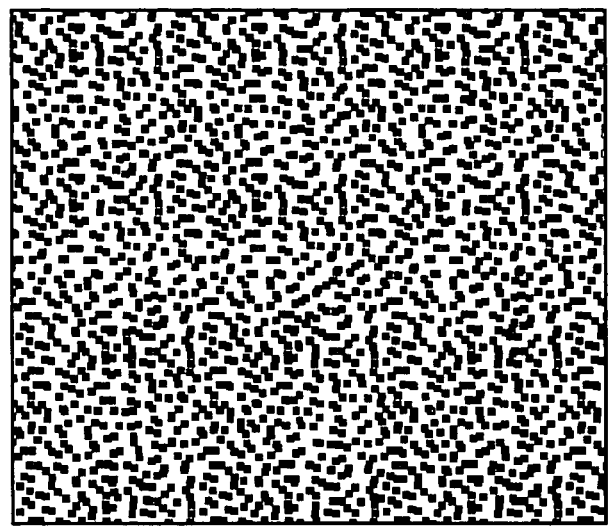
FIG. 2a shows a nanostructure with 2.9 nm particle size manufactured in accordance with an embodiment of the invention.
Figure 2B:
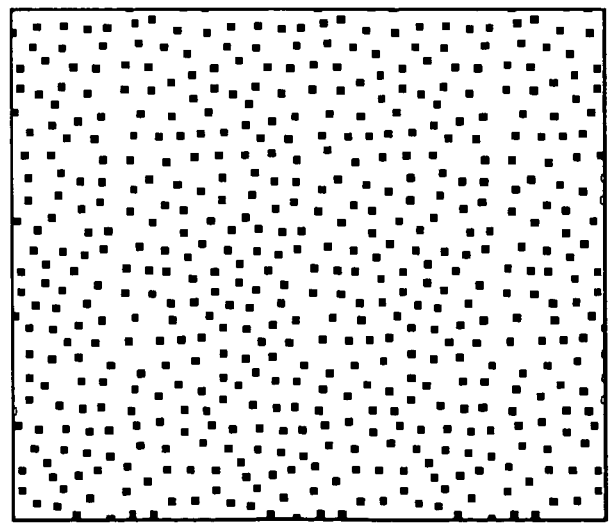
FIG. 2b shows a nanostructure with 7.9 nm particle size manufactured in accordance with an embodiment of the invention.

FIGS. 2a and 2b illustrate a nanoparticle structure with a particle size of 2.9 nm and 7.9 nm, respectively, manufactured in accordance with the embodiment.

Figure 3:
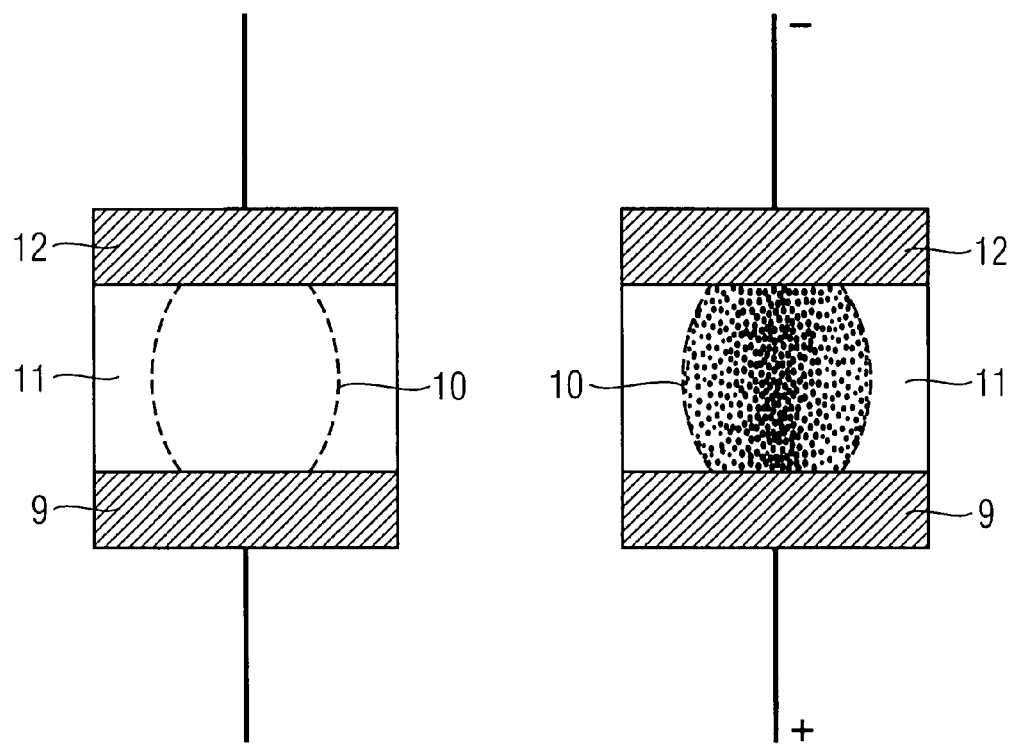
FIG. 3 illustrates the formation of a conductive filament in a nanoparticle.

FIG. 3 shows a $NiO_{1-x}$ nanoparticle 10 in an isolating matrix 11 without (left) and with (right) conductive filament. The nanoparticle is contacted by the bottom electrode 9 and the top electrode 12.

FIGS. 4 and 5 illustrate the configuration of a memory element array. FIG. 4 shows a top view of a memory element array. Word lines 9-1, 9-2 and 9-3 as well as bit lines 12-1, 12-2 and 12-3 are arranged on a substrate 1 made of e.g. silicon. An isolating matrix 11 in which nanoparticles are embedded is arranged between the word lines and the bit lines. The individual word lines and bit lines are in contact with the memory elements S1-S9.

Figure 5A:
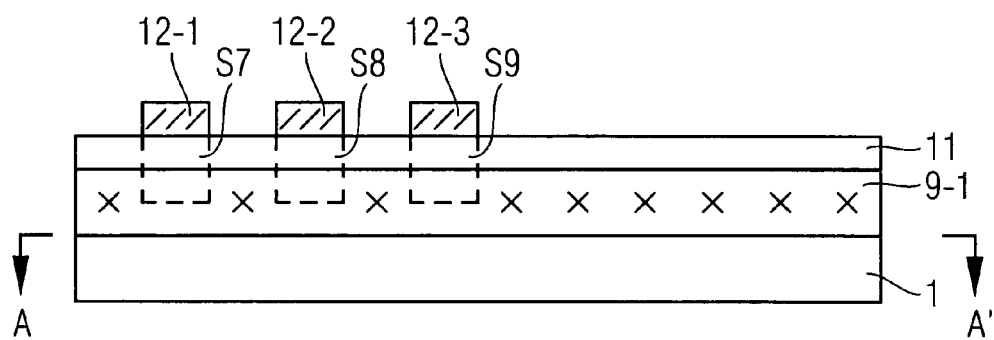
FIG. 5a shows a cross-sectional view through FIG. 4, taken along the line A-A'.
Figure 5B:
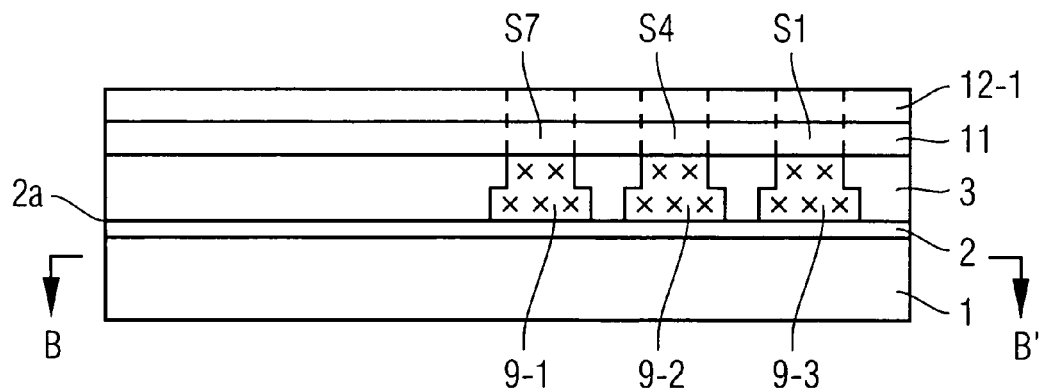
FIG. 5b shows a cross-sectional view through FIG. 4, taken along the line B-B'.

FIG. 5a shows a cross-sectional view taken along the line A-A', and FIG. 5b shows a cross-sectional view taken along the line B-B' in FIG. 4. In FIG. 5a, a wordline 9-1 is arranged on a substrate 1. An isolating matrix 11 in which nanoparticles are embedded is arranged on this wordline. The individual memory elements S7, S8 and S9 are contacted via bit lines 12-1, 12-2 and 12-3 which run, for example, perpendicularly to the wordline 9-1.

FIG. 5b shows a cross-sectional view along the line B-B' in FIG. 4. A layer of silicon oxide 2, an etch stop layer of silicon nitride 2a and another layer of silicon oxide 3 are arranged on the substrate 1. Wordline contacts 9-1, 9-2 and 9-3 are arranged in the layer made of silicon oxide 3. An isolating matrix layer 11 is arranged on the layer of silicon oxide 3. Nanoparticles which define the memory elements S7, S4 and S1 via the word lines 9-1, 9-2 and 9-3 are embedded in this layer 11. A bitline 12-1 which contacts the memory elements S7, S4 and S1 is arranged on the layer of the isolating matrix 11.

Figure 6A:
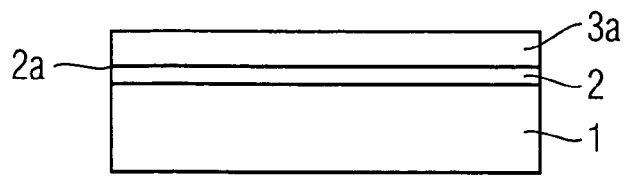
FIG. 6 illustrates a manufacturing process for a bottom contact.
Figure 6B:
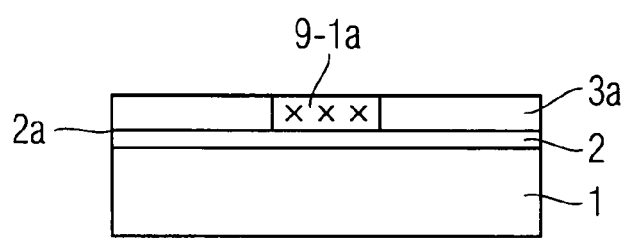
Figure 6C:
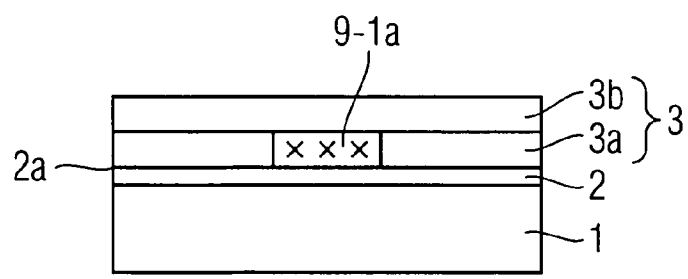
Figure 6D:
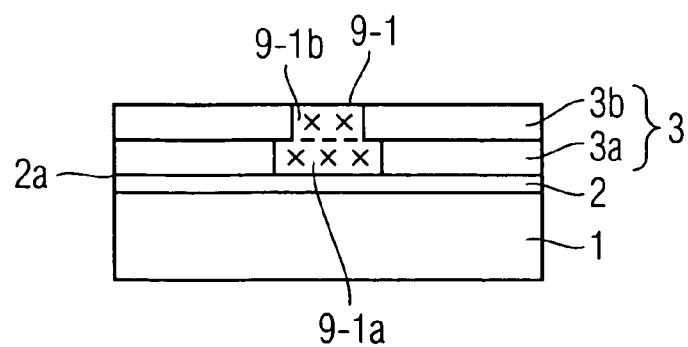

FIG. 6a to 6d illustrate the manufacturing process of a bottom electrode. A layer of silicon oxide 2, an etch stop layer made of silicon nitride 2a and another layer of silicon oxide 3a are arranged on a silicon substrate 1. FIG. 6b illustrates how tungsten 9-1a is deposited into the layer of silicon oxide 3a. FIG. 6c illustrates a layer of silicon oxide 3b arranged on the layer of silicon oxide 3a. This layer of silicon oxide 3b completely covers the deposition of tungsten 9-1a. The layers 3a and 3b can be combined to layer 3. FIG. 6d shows how a sublithographic plug 9-1b has been arranged in the layer of silicon oxide 3b, contacting the deposition of tungsten 9-1a. Both elements 9-1a and 9-1b can be combined to a bottom contact 9-1.

The manufacture of the memory elements is based on a silicon wafer that has been pre-cleaned in accordance with conventional technology. The electrode structure on this silicon wafer is fabricated in accordance with CMOS technology. This is diagrammatically shown for the formation of the bottom electrode in FIG. 6. In accordance with the current state of the art, the size of the sublithographic plugs which define the effective size of the memory cells is about 40 nm. Thus, the dimensions of the memory elements are determined by the dimensions that are currently possible in CMOS technology. As this technology advances, smaller memory elements will be possible.

The fabrication of the metal oxide nanoparticles is performed in accordance with R. F. Mulligan, A. Iliadis, P. Kofinas; J. Appl. Polymer Science, vol. 89 (2003) und R. T. Clay, R. E. Cohen; Supramol. Scienc., vol. 5 (1998). In the examples of Mulligan et al., zinc oxide nanoparticles are deposited. However, this process can be analogously performed for e.g. NiO.

The metal oxide nanoparticles are generated to a process of self-organizing deposition (self-assembled monolayers, SAM) of diblock-copolymer-monolayers. These can be made of polynorbornene and polynorbornene carboxylic acid and form the basis for homogeneous deposition of metal oxide nanocrystallites.

The nanoparticles are embedded in a diblock copolymer. This diblock copolymer can be made of polynorbornene and poly(norbornenedicarboxylic acid), for example. After synthesizing the copolymer, the copolymer is again added to a solution after drying, and a desired amount of $NiCl_2$, which is also dissolved in e.g. tetrahydrofurane, is then added to the solution. The $Ni^{2+}$ ions present in the solution associate with the carboxylic groups of one component of the copolymer. Applying this solution to the tungsten bottom contact, a hexagonally ordered layer grows in a self-organizing process. The solution can be applied by spin-coating, for example. However, it is also possible to simply immerse the wafer into the solution. The resulting metal salt is subsequently converted into the corresponding metal oxide by an ammonium hydroxide base. The copolymer is removed by plasma-ashing.

Thereafter, the nickel oxide particles are partially reduced by a hydrogen processing gas in a plasma process and brought into the oxygen-deficient $NiO_{1-x}$ composition. Remaining on the wafer is a homogeneous dense structure of $NiO_{1-x}$ nanoparticles, as is illustrated in FIG. 2 for nanoparticles of 2.9 and 7.9 nm size.

In order to isolate the nickel oxide nanoparticles 10, a thin $SiO_2$ layer 11 is deposited subsequently by dissociation of hexamethyldisiloxane. This layer 11 is removed by chemical-mechanical polishing (CMP) from the $NiO_{1-x}$ particles 10, until the isolating $SiO_2$ remains only in the gaps therebetween. Providing the dielectric prevents a short-circuit between the top and bottom contacts. The arrangement of a top contact 12 made of, for example, aluminum, titanium or platinum by sputtering completes the memory arrangement.

Although the present invention has been described by way of preferred embodiments, it is by no means limited thereto, and numerous modifications are possible. In particular, the nanoparticles may also be made of transition metal oxides, particularly oxides of niobium, titanium, tungsten, vanadium and iron.

| List of Reference Numerals | |
|---|---|
| 1 | Silicon substrate |
| 2 | Silicon oxide layer |
| 2a | Etch stop layer of silicon nitride |
| 3 | Silicon oxide layer |
| 3a | Silicon oxide layer |
| 3b | Silicon oxide layer |
| 4 | $NiO_{1-x}$ nanoparticle |
| 5 | Silicon oxide isolating layer |
| 6 | Top contact |
| 9-1 | Bottom contact |
| 9-1a | Tungsten deposition |
| 9-1b | Sublithographic plug made of tungsten |
| 10 | Nanoparticles |
| 11 | Isolating matrix |
| 12 | Top contact |
| A, A' | Section line |
| B, B' | Section line |
| K1 | Contact location to bottom contact |
| K2 | Contact location to top contact |
| S | Memory element |
| S1-S9 | Memory elements |

What is claim is:

1. A non-volatile memory cell comprising:
   (a) a first conductive electrode region;
   (b) a second conductive electrode region;
   (c) a memory region arranged therebetween, the memory region comprising one or more metal oxide nanoparticles, which are in contact with and electrically connect the first and the second electrode region via contact locations, and which exhibit a bistable resistance property when applying an external voltage; and
   (d) wherein the metal oxide nanoparticles comprise $NiO_{1-x}$ nanoparticles where x is in the range of 0.5 to 0.95.

2. The memory cell according to claim 1, wherein x is in the range of 0.7 to 0.9.

3. The memory cell according to claim 1, wherein the first electrode region is a tungsten electrode.

4. The memory cell according to claim 1, wherein the second electrode region is made of at least one metal of the group consisting of aluminum, titanium and platinum.

5. A non-volatile memory cell arrangement comprising a plurality of memory cells according to claim 1.

6. The non-volatile memory cell arrangement according to claim 5, wherein the memory cells are arranged in a crosspoint array.

* * * * *